(12) United States Patent
Obara et al.

(10) Patent No.: US 7,011,887 B2
(45) Date of Patent: Mar. 14, 2006

(54) IT-CUT QUARTZ CRYSTAL UNIT

(75) Inventors: Shigeru Obara, Sayama (JP); Genwa Koki, Sayama (JP); Kouichi Hara, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 379 days.

(21) Appl. No.: 10/652,073

(22) Filed: Sep. 2, 2003

(65) Prior Publication Data
US 2004/0173141 A1  Sep. 9, 2004

(30) Foreign Application Priority Data
Sep. 2, 2002  (JP) .............. 2002-257090
Sep. 2, 2002  (JP) .............. 2002-257091

(51) Int. Cl.
*B32B 17/00* (2006.01)

(52) U.S. Cl. ............. 428/426; 428/432; 428/469; 310/310; 310/311; 310/320; 310/348; 310/360; 310/361; 310/367; 310/368; 310/369; 331/158

(58) Field of Classification Search ............. 310/361, 310/320, 348, 360, 367, 368, 369; 428/426
See application file for complete search history.

(56) References Cited

U.S. PATENT DOCUMENTS 4,454,443 A * 6/1984 Lukaszek et al. .......... 310/348
6,300,707 B1 10/2001 Takehana et al.

FOREIGN PATENT DOCUMENTS

JP       11-177376       7/1999

* cited by examiner

*Primary Examiner*—Deborah Jones
*Assistant Examiner*—Elizabeth D. Ivey
(74) *Attorney, Agent, or Firm*—Oblon, Spivak, McClelland, Maier & Neustadt, P.C.

(57) ABSTRACT

An IT-cut quartz crystal unit has a discoidal or a rectangular quartz crystal blank which is cut from a crystal of quartz along a plane perpendicular to the Y-axis of the crystal of the quartz which is rotated over approximately 34° about the X-axis, and further rotated from this rotated position over approximately 19° about the Z-axis. Excitation electrodes are formed on both main surface of the crystal blank, respectively. The crystal blank is held at positions in at least one set of opposing peripheral regions selected from an angular range of 18°±18° from the Z'-axis on the surface of the crystal blank, viewed from the center on the surface of the crystal blank; an angular range of 198°±18° from the Z'-axis; an angular range of 108°±18° from the Z'-axis; and an angular range of 288°±18° from the Z'-axis.

9 Claims, 7 Drawing Sheets

IT-CUT QUARTZ CRYSTAL UNIT

BACKGROUND OF THE INVENTION

1. Field of the Invention

The present invention relates to an IT-cut quartz crystal unit, and more particularly to an IT-cut crystal unit which can provide satisfactory vibration characteristics.

2. Background of the Invention

Quartz crystal units for use as reference sources of frequency and time are classified into several types of "cuts" according to the crystallographic orientation in which a vibrating plate, i.e., a quartz crystal blank, forming part of a crystal unit, is cut from a single crystal of quartz. Conventionally, X-cut, AT-cut, BT-cut, and the like have been known as such types of cuts. Also, an SC-cut crystal unit is known as a double-rotation crystal unit, for example, as disclosed in JP-A-11-177376. The double-rotation crystal unit cited here refers to a crystal unit which has a crystal blank that is cut from a crystal of quartz in the following manner. A plane perpendicular to one of three crystal axes of the quartz is rotated over a predetermined angle about one of the remaining two crystal axes, and is further rotated over another predetermined angle about the last crystal axis. The crystal blank of the double-rotation crystal unit is cut from the crystal of quartz along the thus rotated plane.

As Illustrated in FIG. 1, for example, an SC-cut crystal unit uses crystal blank 1 which is cut from a crystal of quartz along a plane perpendicular to the Y-axis of the crystal of the quartz which is rotated over approximately 30° about the X-axis, and further rotated over approximately 22° about the Z-axis from the rotated position. Excitation electrodes are formed on both main surfaces of this crystal unit 1.

Like the AT-cut crystal unit, the SC-cut crystal unit has the temperature-frequency characteristic which can be represented by a cubic function curve, and is used in a temperature region near an extremal value on the cubic function curve, where the frequency is deemed to vary less due to changes in temperature. The SC-cut crystal unit has an inflection point on the cubic function curve at 94° C., and is used as a crystal unit for an oven-controlled crystal oscillator because it has a inflection point at such a high temperature.

However, the SC-cut crystal unit has the inflection point at 94° C., so that if an extremal value at a temperature lower than the inflection point is set for a target temperature of the oven, the target temperature will be in the range of 65° C. to 85° C. Thus, if the SC-cut crystal unit is utilized in a crystal oscillator which is used over a wide temperature range, for example, when it is required to operate up to 80° C. on the high temperature side, a smaller margin between the set temperature of the oven and the ambient temperature will make it difficult to control the oven at a fixed temperature, thereby failing to maintain a fixed oscillation frequency.

To solve this problem, it is under review to use an IT-cut quartz crystal unit instead of the SC-cut crystal unit. The IT-cut crystal unit, which is a double-rotation crystal unit similar to the SC-cut crystal unit, utilizes crystal blank 2 which is cut from a crystal of quartz along a plane perpendicular to the Y-axis of the crystal of the quartz which is rotated over approximately 34° about the X-axis, and further rotated over approximately 19° about the Z-axis from the rotated position. Excitation electrodes are formed on both main surfaces of crystal blank 2.

While the IT-cut crystal unit has the temperature-frequency characteristic which exhibits a change similar to the temperature-frequency characteristic of the SC-cut crystal unit, its inflection point temperature is at 74° C. which is lower than that of the SC-cut crystal unit. In addition, the IT-cut crystal unit has an extremal point in the range of 85° C. to 105° C. on the higher temperature side of the inflection point. For this reason, a crystal oscillator using the IT-cut crystal unit can set an oven at a temperature in the range of 85° C. to 105° C., even if it is required to operate at a maximum temperature of 80° C. and can relatively readily control the temperature.

However, there are very few instances of IT-cut crystal units, and particularly, any solution has not been brought about for the relationship between a position at which the crystal blank is supported and the vibration characteristics.

SUMMARY OF THE INVENTION

It is an object of the present invention to provide an IT-cut crystal unit which is capable of achieving satisfactory vibration characteristics by defining positions at which a crystal blank is supported.

The foregoing object of the present Invention is achieved by an IT-cut crystal unit which has a crystal blank cut from a crystal of quartz along a plane perpendicular to a Y-axis of the crystal of the quartz which is rotated over approximately 34° about an X-axis, and further rotated from the rotated position over approximately 19° about a Z-axis, and excitation electrodes formed on both main surfaces of the crystal blank, respectively, wherein the crystal blank includes first to fourth positions on a peripheral region thereof, the first position being defined in an angular range of 18°±18° from a Z'-axis on the surface of the crystal blank, when viewed from the center on the surface of the crystal blank, the second position being defined in an angular range of 198°±18° from the Z'-axis on the surface of the crystal blank, the third positions being defined in an angular range of 108°±18° from the Z'-axis on the surface of the crystal blank, and the fourth position being defined in an angular range of 288°±18° from the Z'-axis on the surface of the crystal blank, and the crystal blank has hold positions at at least one set of opposing positions selected from the first to fourth positions.

In other words, the crystal blank is held at positions in at least one set of opposing peripheral regions of the crystal blank selected from an angular range of 0° to 36° from the Z'-axis on the surface of the crystal blank, when viewed from the center on the surface of the crystal blank; an angular range of 180° to 216° from the Z'-axis on the surface of the crystal blank; an angular range of 90° to 126° from the Z-axis on the surface of the crystal blank; and an angular range of 270° to 306° from the Z'-axis on the surface of the crystal blank.

By thus determining the positions at which the IT-cut crystal blank is held, the IT-cut crystal unit of the present invention has the crystal blank held at positions which suffer from relatively small vibration displacements without damaging the vibration characteristics, reduces the influence of the mechanism for holding the crystal blank on the vibration characteristics of the crystal blank, and consequently achieves satisfactory vibration characteristics.

DETAILED DESCRIPTION OF THE INVENTION

Figure 3A:
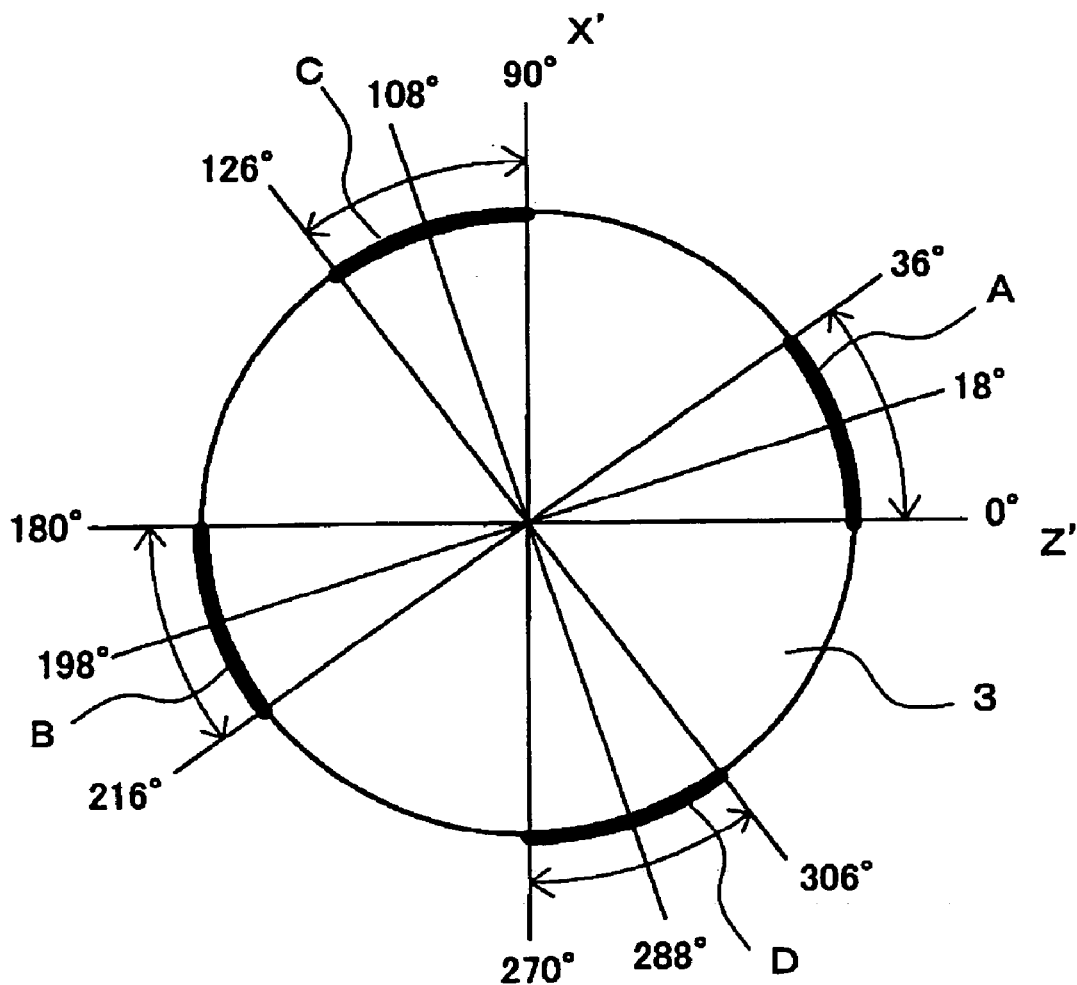
FIGS. 3A and 3B are a plan view and a cross-sectional view, respectively, of a crystal blank for use in a crystal unit according to a first embodiment of the present invention.
Figure 3B:
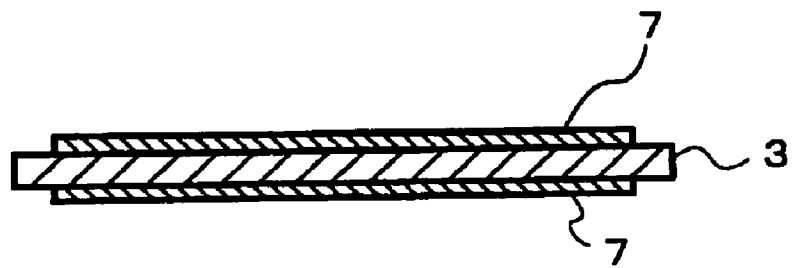

FIG. 3A illustrates a quartz crystal blank for use in a quartz crystal unit according to a first embodiment of the present invention, where discoidal crystal blank 3 is illustrated. As illustrated in FIG. 3B, excitation electrodes 7 are disposed on both main surfaces of crystal blank 3 in opposition to each other. For the sake of description, the excitation electrodes are not shown in FIG. 3A.

Figure 1:
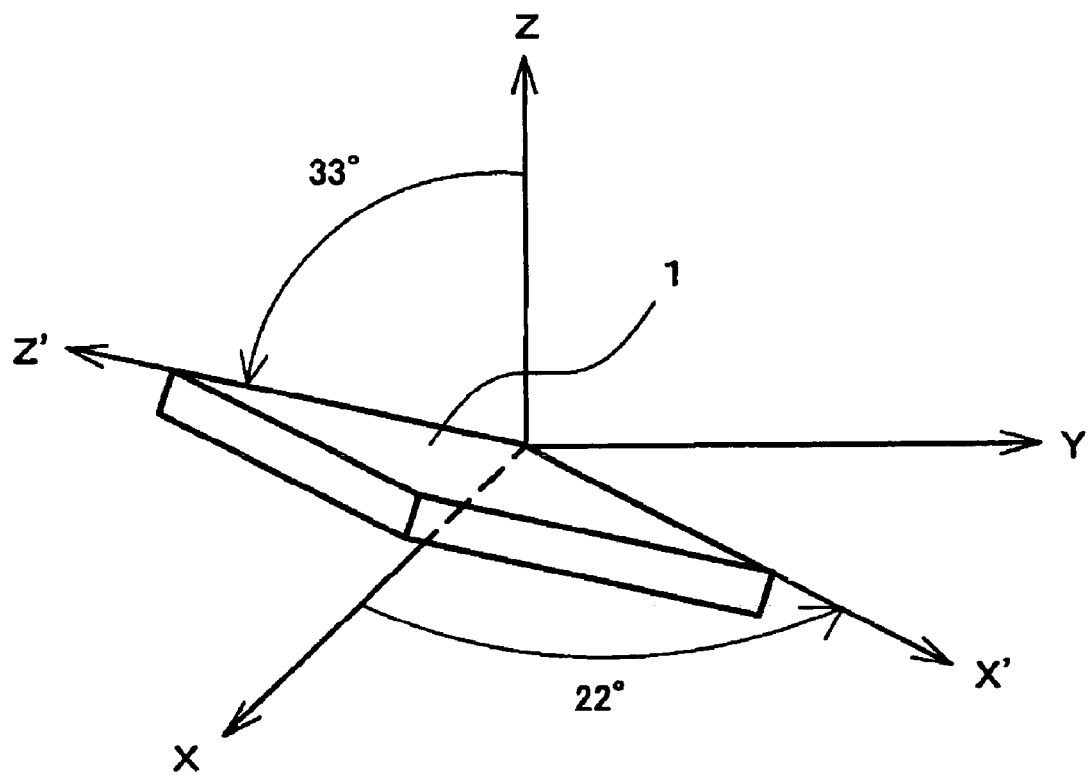
FIG. 1 is a diagram for explaining an orientation in which an SC-cut crystal blank is cut from a crystal of quartz.
Figure 2:
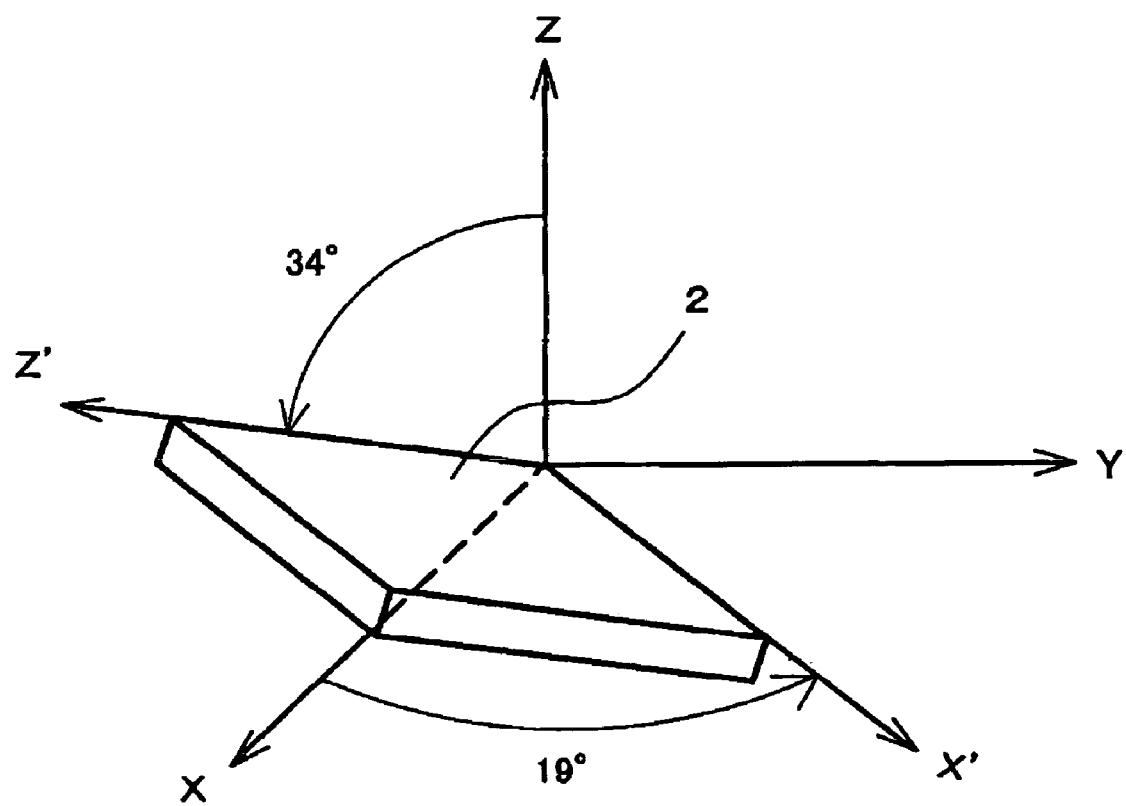
FIG. 2 is a diagram for explaining an orientation in which an IT-cut crystal blank is cut from a crystal of quartz.

Crystal blank 3 Illustrated in FIG. 3A is an IT-cut crystal blank which is cut from a crystal of quartz along a plane perpendicular to the Y-axis of the crystal of the quartz that is rotated over approximately 34° about the X-axis, and further rotated from this rotated position over approximately 19° about the Z-axis. Here the X-, Y-, and z-axes are crystallographically defined in the crystal of the quartz. In FIG. 3, a Z'-axis extends in the horizontal direction, and an X'-axis extends in the vertical direction. As illustrated in FIG. 2, the X'-axis is defined by rotating the X-axis over approximately 19° about the Z-axis, while the Z'-axis is defined by rotating the Z-axis over approximately 34° about the X'-axis.

Discoidal crystal blank 3 has ranges A to D set in its peripheral regions, and is h ld, for xample, by a holder m mber, not shown, which holds discoidal crystal blank 3 in at least two of these ranges. In this event, crystal blank 3 is held in at least one set of the ranges which oppose each other.

Assume herein intersection O of X'-axis with Z'-axis on crystal blank 3. This intersection O is typically at the center on the surface of discoidal crystal blank 3. With the intersection O thus defined, range A lies in an angular range of 18°±18° from the Z'-axis viewed from intersection O; range B lies in an angular range of 198°±18° from the Z-axis viewed from intersection O; range C lies in an angular range of 108°±18° from the Z'-axis viewed from intersection O; and range D lies in an angular range of 288°±18° from the Z'-axis viewed from intersection O. In this event, crystal blank 3 may be held in one set of ranges using the overall peripheral regions in the respective ranges or using only partial positions of the peripheral regions in the respective ranges. Alternatively, one to a plurality of holding points may be set in each range, such that crystal blank 3 is held at these holding points in one set of ranges.

In this embodiment, crystal blank 3 Is held at positions defined as described above for the reason set forth below.

Figure 4:
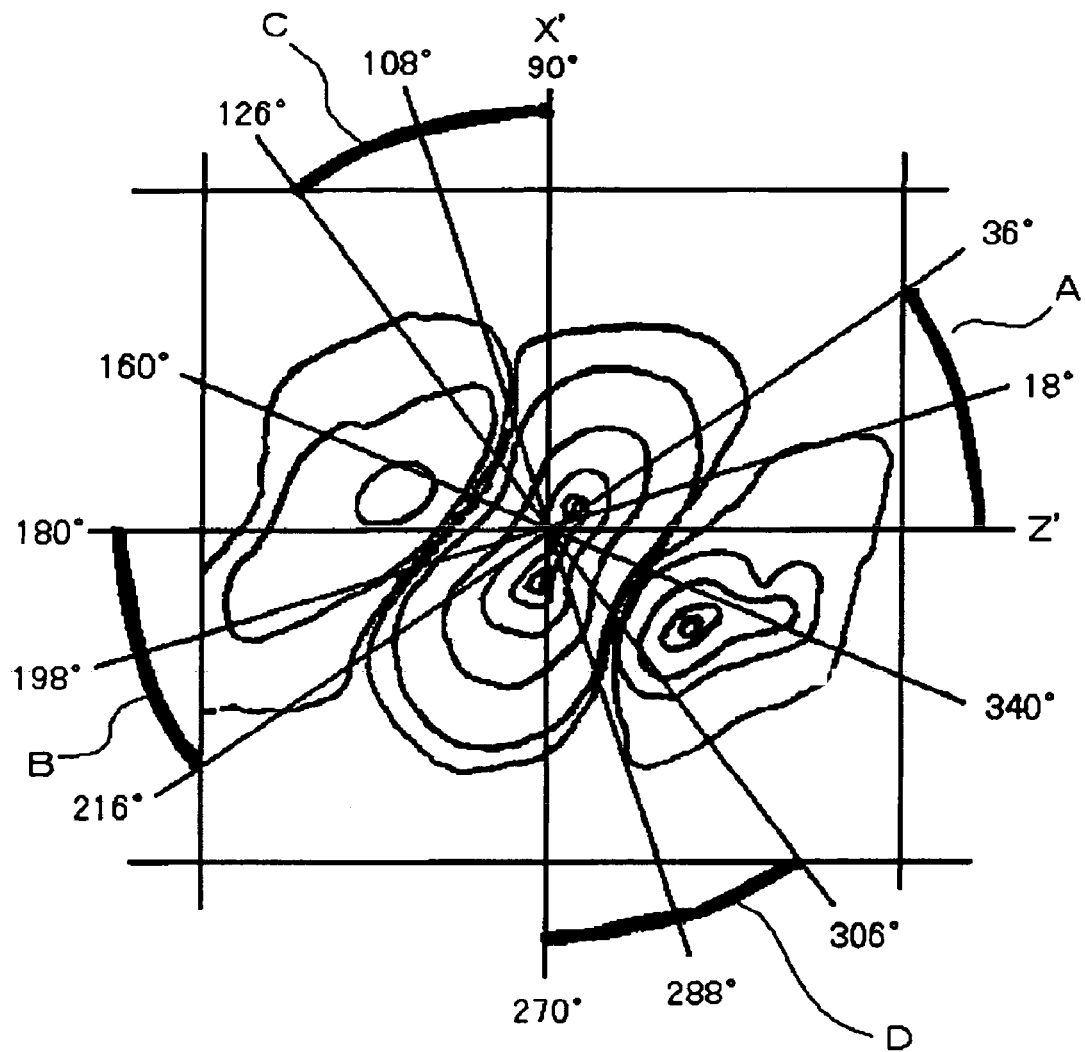
FIG. 4 is a diagram showing a distribution of vibration displacements in an IT-cut crystal blank.

FIG. 4 illustrates a displacement distribution of an IT-cut crystal blank observed by the present inventors when the IT-cut crystal blank was excited with piezoelectric vibration. In FIG. 4, wherein the Z'-axis of the crystal blank extends in the horizontal direction, and the X'-axis extends in the vertical direction, contour lines represent positions and sizes of displacements.

Generally, in a crystal unit, a crystal blank is preferably held at those portions which suffer from less vibration displacements in order to minimize the influence exerted to the vibration characteristics. With the IT-cut crystal blank, relatively large displacements are found on a line which connects the direction of 160° from the Z'-axis with the direction of 340° from the Z'-axis, viewed from the center of crystal blank 3, as can be seen from FIG. 4. Therefore, for avoiding these directions, regions used for holding crystal blank 3 are determined in the following four ranges: an angular range of 18°±18° from the Z'-axis, and more preferably of 18°±9° from the Z'-axis, viewed from the center of crystal blank 3; an angular range of 198°±18° from the Z'-axis, and more preferably of 198°±9° from the Z'-axis; an angular range of 108°±18° from the Z'-axis, and more preferably of 108°±9° from the Z'-axis; and an angular range of 288°±18° from the Z'-axis, and more preferably of 288°±9° from the Z'-axis. Then, crystal blank 3 is held at positions in at least one pair of opposing ranges selected from the foregoing four ranges which include peripheral regions.

In this way, the IT-cut crystal blank can be held at positions which suffer from relatively small vibration displacements, so that the resulting crystal unit can achieve satisfactory vibration characteristics. It is also possible to reduce the influence exerted on the vibration characteristics of crystal blank 3 by a stress applied to crystal blank 3 from the structure for holding crystal blank 3.

For using the crystal unit as described above in an oven which is heated, for example, to approximately 100° C., a conductive adhesive is not used for holding crystal blank 3, but instead, a gold-germanium alloy, for example, may be used for holding crystal blank 3 and for providing electric conduction from the excitation electrodes to the outside. While a crystal blank is generally held at two points, it may be held at four points In some cases for maintaining a mechanical strength. When crystal blank 3 is held at four points in this manner, crystal blank 3 may be held at positions included in the respective ranges A, B, C, D, in which case crystal blank 3 can be conveniently held at equal intervals, and can be mechanically well-balanced.

Figure 5:
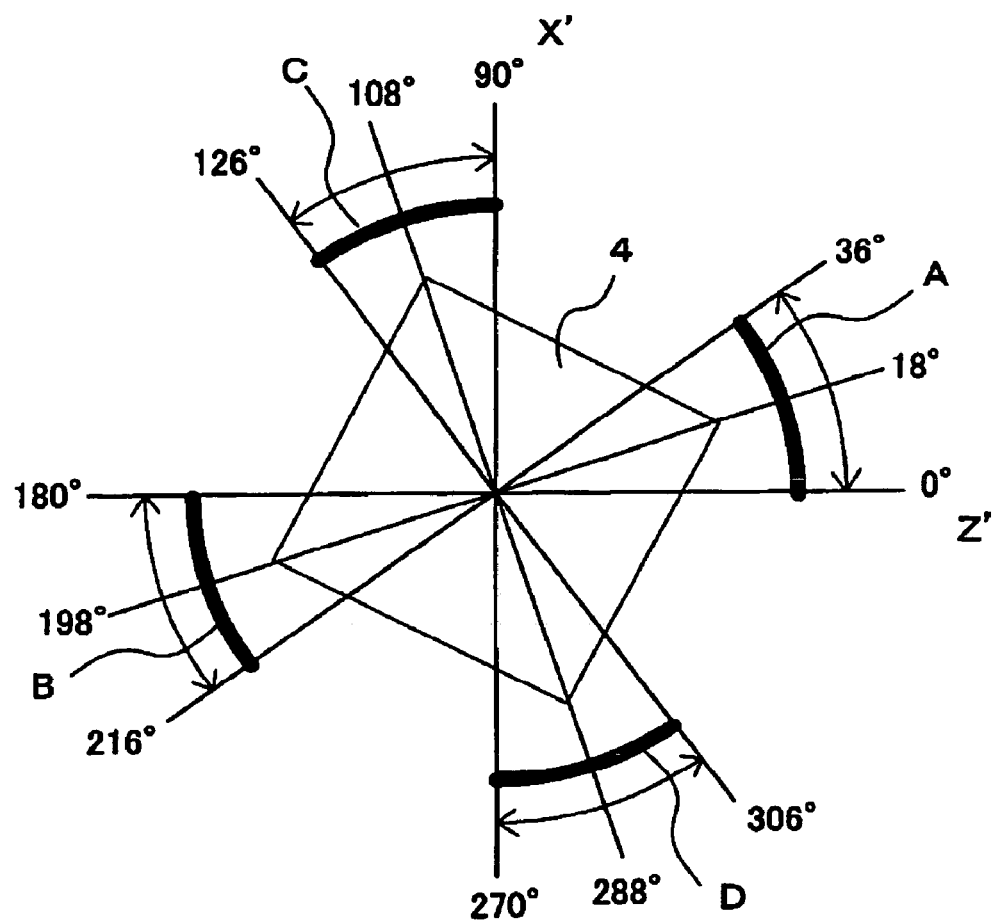
FIG. 5 is a plan view of a crystal blank for use in a crystal unit according to a second embodiment of the present invention.

While FIG. 3 Illustrates a discoidal crystal blank, the present invention is not limited to the crystal blank in this particular shape. The present invention can be applied as well to substantially square IT-cut crystal blank 4 as illustrated in FIG. 5. Though not shown here, crystal blank 4 is also provided with excitation electrodes on both main surfaces thereof, respectively, as is the case with crystal blank 3 illustrated in FIG. 3A.

Generally, the substantially square crystal blank is held at its diagonal ends. Therefore, in crystal blank 4 for use in a crystal unit according to a second embodiment of the present invention illustrated In FIG. 5, one diagonal connects a range (A in the drawing) of 18°±18° from the Z'-axis, and more preferably of 18°±9° from the Z'-axis to a range (B in the drawing) of 198°±18° from the Z'-axis, and more preferably of 198°±9° from the Z'-axis, while the other diagonal connects a range (C in the drawing) of 108°±18° from the Z'-axis, and more preferably of 108°±9° from the Z-axis to a range (D in the drawing) of 288°±18° from the Z'-axis, and more preferably of 288°±9° from the Z'-axis. Then, crystal blank 4 is held at positions which includes at least two opposing corners.

Figure 6:
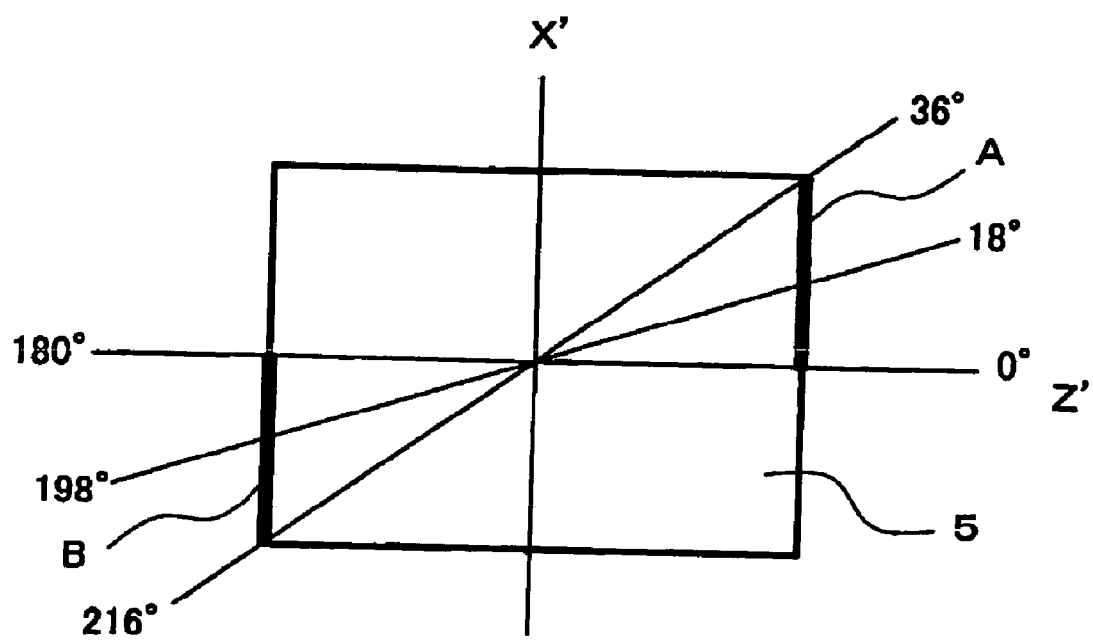
FIG. 6 is a plan view of a crystal blank for use in a crystal unit according to a third embodiment of the present invention.

The present invention can further be applied to a rectangular crystal blank. FIG. 6 illustrates a crystal blank for use in a crystal unit according to a third embodiment of the present Invention. Illustrated crystal blank 5 is rectangular IT-cut crystal blank 5 elongated in the Z'-axis direction. This crystal blank 5 is cut from a crystal of quartz along a plane perpendicular to the Y-axis of the crystal of the quartz which is rotated over approximately 34° about the X-axis, and further rotated from this rotated position over approximately 19° about the Z-direction. Though not shown here, crystal blank 5 is also provided with excitation electrodes on both main surfaces thereof, respectively, as is the case with tat illustrated in FIG. 3A.

Crystal blank 5 is held at positions which are included in range A of 18°±18° from the Z'-axis and range B of 198°±18° from the Z'-axis, viewed from the center O on the surface of crystal blank 5. In this event, crystal blank 5 may be held over the entire ranges A, B, respectively, or may be held at a portion of range A and a portion of range B. Alternatively, crystal blank 5 may be held at one or a plurality of points in range A and at one or a plurality of points in range B. Preferably, both ends of one diagonal of crystal blank 5 are positioned in these ranges A, B.

Crystal blank 5 is held at such positions as described above in order to avoid a direction in which a large displacement distribution is observed on the IT-cut crystal blank, as illustrated in FIG. 4. Therefore, crystal blank 5 is held at the positions included in the angular range of 18°±18° from the Z'-axis, and more preferably of 18°±9° from the Z'-axis, viewed from the center on the surface of crystal blank 5, and in the angular range of 198°±18° from the Z'-axis, and more preferably of 198°±9° from the Z'-axis. Likewise, in the third embodiment, the crystal blank can be held at positions which suffer from relatively small vibration displacements, so that the resulting crystal unit can achieve satisfactory vibration characteristics. It is also possible to reduce the Influence exerted on the vibration characteristics of the crystal blank by a stress applied thereto from the structure for holding the crystal blank.

Figure 7:
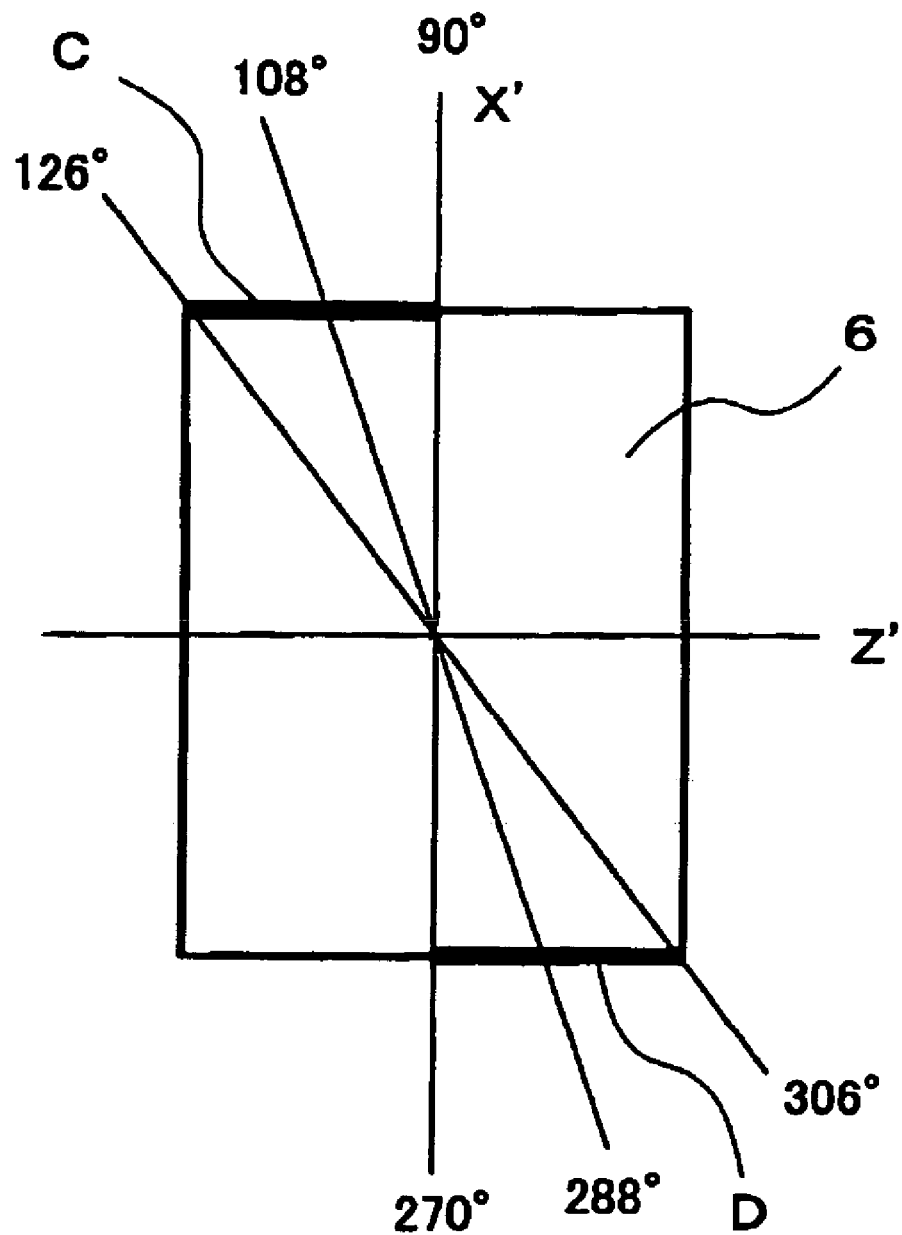
FIG. 7 Is a plan view of a crystal blank for use in a crystal unit according to a fourth embodiment of the present invention.

Moreover, the present invention is not limited to the rectangular crystal blank elongated in the Z'-direction. Crystal blank 6 illustrated In FIG. 7 is an IT-cut crystal blank elongated in the X'-direction to which the present invention can be applied as well.

With rectangular crystal blank 6 elongated in the X'-direction, crystal blank 6 may be held in a range (C in FIG. 7) of 108°±18° from the Z'-direction, and more preferably of 108°±9° from the Z'-direction, viewed from center O on the surface of crystal blank 6 and in a range (D In FIG. 7) of 288°±18° from the Z'-axis, and more preferably of 288°±9° from the Z'-axis.

What is claimed is:

1. An IT-cut crystal unit comprising:
    a crystal blank cut from a crystal of quartz along a plane perpendicular to a Y-axis of the crystal of the quartz which is rotated over approximately 34° about an X-axis, and further rotated from the rotated position over approximately 19° about a Z-axis; and
    excitation electrodes formed on both main surfaces of said crystal blank, respectively,
    wherein said crystal blank includes first to fourth positions on a peripheral region thereof, said first position being defined in an angular range of 18°±18° from a Z'-axis on a surface of said crystal blank, when viewed from a center on the surface of the crystal blank, said second position being defined in an angular range of 198°±18° from the Z'-axis on the surface of said crystal blank, the third position being defined in an angular range of 108°±18° from the Z'-axis on the surface of said crystal blank, and the fourth position being defined in an angular range of 288°±18° from the Z'-axis on the surface of said crystal blank,
    said crystal blank has holding positions at at least one set of opposing positions selected from said first to fourth positions.

2. The crystal unit according to claim 1, wherein said crystal blank is a discoidal crystal blank.

3. The crystal unit according to claim 1, wherein said crystal blank is a rectangular crystal blank.

4. The crystal unit according to claim 3, wherein said crystal blank includes a pair of diagonals, one of which extends in a direction within an angular range of 18°±18° from the Z'-axis, and the other of which extends in a direction within an angular range of 108°±18° from the Z'-axis.

5. The crystal unit according to claim 4, wherein said crystal blank has the hold positions at both ends of said one diagonal or at both ends of said other diagonal.

6. The crystal unit according to claim 3, wherein said crystal blank is elongated in the Z'-direction, and has the hold positions at said first and second positions.

7. The crystal unit according to claim 4, wherein said crystal blank is elongated in the X'-direction, and has hold positions at said third and fourth positions.

8. The crystal unit according to claim 1, wherein said crystal blank has hold positions at said first to fourth positions.

9. The crystal blank according to claim 1, wherein said first position is defined in an angular range of 18°±9° from a Z'-axis on the surface of said crystal blank when viewed from the center, said second position is defined in an angular range of 198°±9° from the Z-axis on the surface of said crystal blank when viewed from the center, the third position is defined in an angular range of 108°±9° from the Z'-axis on the surface of said crystal blank when viewed from the center, and the fourth position is defined in an angular range of 288°±9° from the Z'-axis on the surface of said crystal blank when viewed from the center.

* * * * *